United States Patent [19]

Hiroshi et al.

[11] Patent Number: 5,389,154
[45] Date of Patent: Feb. 14, 1995

[54] PLASMA PROCESSING APPARATUS

[75] Inventors: Nishimura Hiroshi; Ono Toshiro; Matsuo Seitaro, all of Kanagawa, Japan

[73] Assignee: Nippon Telegraph and Telephone, Tokyo, Japan

[21] Appl. No.: 81,934

[22] Filed: Jun. 24, 1993

[30] Foreign Application Priority Data

Jun. 23, 1992 [JP] Japan .................................. 4-187369
Mar. 22, 1993 [JP] Japan .................................. 5-085183

[51] Int. Cl.6 ............................................. C23C 16/50
[52] U.S. Cl. ..................... 118/723 MR; 118/723 ME; 118/723 MW; 156/345; 204/298.38
[58] Field of Search ...................... 204/298.16, 298.38; 156/345; 427/508, 553, 575, 595; 118/723 MW, 723 MA, 723 MR, 723 ME

[56] References Cited

U.S. PATENT DOCUMENTS

| | | | |
|---|---|---|---|
| 4,940,015 | 7/1990 | Kobashi et al. | 118/723 |
| 5,125,358 | 6/1992 | Ueda et al. | 118/723 |
| 5,146,138 | 9/1992 | Ootera et al. | 204/298.38 X |
| 5,234,565 | 8/1993 | Yoshida | 156/345 X |

FOREIGN PATENT DOCUMENTS

| | | |
|---|---|---|
| 0388800A3 | 9/1990 | European Pat. Off. . |
| 0415122A2 | 3/1991 | European Pat. Off. . |
| 0421348A1 | 4/1991 | European Pat. Off. . |
| 54-91194 | 7/1979 | Japan . |
| 6243335 | of 1987 | Japan . |
| 63-98330 | 4/1988 | Japan . |

OTHER PUBLICATIONS

Toshiro Ono et al., "Electron Cyclotron Resonance Plasma Deposition Technique Using Raw Material Supply by Sputtering", *Japanese Journal of Applied Physics*, vol. 23, 8 Aug. 1984, pp. L534–L536.
Takashi Akahori et al., "Preparation of TiN Films by Electron Cyclotron Resonance Plasma Chemical Vapor Deposition", *Japanese Journal of Applied Physics*, vol. 30, 12B, Dec. 1991, pp. 3558–3561.
Morito Matsuoka et al., "A Few Techniques for Preparing Conductive Material Films for Sputtering-Type Electron Cyclotron Resonance Microwave Plasma", *Japanese Journal of Applied Physics*, vol. 28, 3 Mar. 1989, pp. L503–L506.

*Primary Examiner*—Nam Nguyen
*Attorney, Agent, or Firm*—Townsend and Townsend Khourie and Crew

[57] ABSTRACT

In a plasma processing apparatus, a second microwave guiding unit has at least one vacuum waveguide with a dielectric window and an opening being formed on the side of the microwave introducing hole. The vacuum waveguide is arranged at a position where an external magnetic field applied from an external magnetic field applying unit is stronger than an ECR condition, and causes the microwave guided from a first microwave guiding unit to propagate through the dielectric window in a direction perpendicular to the external magnetic field such that the electric field of the microwave is parallel to the external magnetic field applied to the second microwave guiding unit by the external magnetic field applying unit. The dielectric window is arranged at a position at which at least a portion of the dielectric window cannot been seen directly from the microwave introducing hole. The propagating direction of the microwave is changed at a position immediately above the plasma chamber, at which the external magnetic field strength is higher than the ECR condition, thereby introducing, through the opening, the microwave to the microwave introducing hole along the external magnetic field, whereby converting a raw material in the plasma chamber into plasma by electron cyclotron resonance (ECR).

8 Claims, 14 Drawing Sheets

PLASMA PROCESSING APPARATUS

BACKGROUND OF THE INVENTION

The present invention relates to a plasma processing apparatus and, more particularly, to a plasma processing apparatus for forming thin films by introducing a microwave into a plasma chamber through a dielectric window with an external magnetic field being applied to the plasma chamber, converting a raw material in the plasma chamber into plasma by ECR (Electron Cyclotron Resonance), and radiating the resultant plasma onto a specimen.

FIG. 14 shows an example of a conventional plasma processing apparatus. As a plasma processing apparatus of this type, "Plasma Deposition Apparatus" disclosed in Japanese Patent Publication No. 62-43335 (Japanese Patent Application No. 55-57877) and "Plasma Processing Method and Apparatus" disclosed in Japanese Patent Laid-Open No. 1-97399 (Japanese Patent Application No. 63-98330) are known.

Referring to FIG. 14, reference numeral 10 denotes a specimen chamber; 20, a plasma chamber; and 30, a microwave supplying means. The specimen chamber 10 has a specimen holder 11 for holding a specimen 40 and communicates with an exhaust passage 13 through a ventilation hole 12 formed below the specimen holder 11. The specimen chamber 10 also communicates with the plasma chamber 20 through a plasma extracting opening 21 on the side away from the exhaust passage 13.

A first gas is introduced into the plasma chamber 20 from a first gas source GS1 through a gas inlet pipe 22 as a first gas introducing system. An annular pipe 23 with a plurality of small holes is arranged outside (in this apparatus, inside the specimen chamber 10) and close to the plasma extracting opening 21, introducing a second gas to the specimen chamber 10 from a second gas source GS2 through a gas inlet pipe 24 as a second gas introducing system. An annular cooling unit 25 is also arranged around the plasma chamber 20 to supply a coolant, such as water, from a coolant source CS through a cooling pipe 26.

In the plasma generating chamber 20, a microwave introducing window (dielectric window) 27 consisting of, e.g., a quartz glass plate, is provided on the end face (the upper surface in FIG. 14) opposing the opening 21. A microwave from the microwave supplying means 30 is introduced into the plasma chamber 20 through this microwave introducing window 27 while maintaining the vacuum degree. A microwave mode transducer 35 is arranged between a rectangular waveguide 33 and the microwave introducing window 27 to tune the rectangular waveguide mode of a microwave with the microwave propagation mode in plasma.

An annular magnetic coil 50 is arranged around the outer circumferential surfaces of the plasma chamber 20 and the microwave mode transducer 35 and a partial outer circumferential surface of the rectangular waveguide 33 connected to the converter 35. The magnetic coil 50 generates an external magnetic field B required to generate ECR (875 G at a microwave frequency of 2.45 GHz). In practice, the magnetic coil 50 is also cooled like the plasma chamber 20.

In the apparatus with the above arrangement, the first gas introduced as a raw material into the plasma chamber 20 is excited under the ECR condition by a microwave introduced through the microwave introducing window 27 and is converted into plasma. The plasma thus generated is guided to a position above the specimen holder 11 in the specimen chamber 10 by using a magnetic field gradient, forming a thin film on the specimen 40 placed on the specimen holder 11.

The plasma processing apparatus with the above arrangement which forms thin films by using ECR plasma has various characteristics, such as a low gas pressure ($10^{-4}$ to $10^{-5}$ Torr), a high activity, and a low damage, and can therefore form dense, high-quality thin films of, e.g., $SiO_2$, $Si_3N_4$, and SiC at low temperatures without heating.

In the arrangement shown in FIG. 14, however, the microwave introducing window 27 is in contact with the plasma chamber 20, and so a thin film is also deposited on the microwave introducing window 27 during formation of the thin film. In forming a conductive film, therefore, the conductive film is also formed on the microwave introducing window 27 with the result that a microwave is reflected or absorbed by that film. Consequently, plasma can no longer be maintained to make the film formation impossible. In some cases, the microwave introduction conditions gradually change to impair the reproducibility. As described above, the conventional apparatus with the above arrangement cannot form conductive films stably for long periods of time because the conductive films are deposited on the microwave introducing window 27.

ECR plasma apparatuses as shown in FIGS. 15, 16, and 17, which aim to avoid the deposition of conductive films on the microwave introducing window 27 described above, are also known to those skilled in the art. However, these apparatuses have their respective problems. In FIGS. 15, 16, and 17, the same reference numerals as in FIG. 14 denote the same parts or parts having the same functions.

First, in the arrangement shown in FIG. 15, the microwave introducing window 27 is arranged at a position at which the microwave introducing window 27 cannot be seen directly from a microwave introducing opening 28, i.e., a position at a dead angle from the microwave introducing opening 28. In addition, a ferromagnetic member 71, such as a yoke, is arranged between the magnetic coil 50 and a vacuum waveguide 72. A microwave is introduced into the plasma chamber 20 through the microwave introducing window 27 and the vacuum waveguide 72. The other arrangement is the same as that shown in FIG. 14.

In the arrangement shown in FIG. 15, since the microwave introducing window 27 is arranged at a position to which no plasma particles fly directly, conductive films are not deposited easily on the microwave introducing window 27 compared to the arrangement shown in FIG. 14. In this case, the generation of plasma inside the vacuum waveguide 72 is a problem. In this arrangement, however, the generation of plasma inside the vacuum waveguide 72 is suppressed by decreasing the magnetic flux density inside the vacuum waveguide 72 by arranging the ferromagnetic member 71 around the vacuum waveguide 72 (Jpn. J. Appl. Phys. 28 (1989) L503-L506 "A Few Techniques for Preparing Conductive Material Films for Sputtering-Type Electron Cyclotron Resonance Microwave Plasma" by Morito Matsuoka and Ken'ichi Ono).

In this arrangement, however, since the magnetic field in the vacuum waveguide 72 is weak, a microwave is cut off in the vacuum waveguide 72 by plasma diffusing from the plasma chamber 20. This causes reflection of the microwave to result in a low plasma density.

In the apparatus shown in FIG. 16, like the above arrangement, the microwave introducing window 27 is arranged at a position to which no plasma particles fly directly, and consequently conductive films are not easily deposited on the microwave introducing window 27. The vacuum waveguide 72 is coupled to the plasma chamber 20 through a portion between two magnetic coils 51 and 52. A microwave from a microwave source 31 passes through the microwave introducing window 27, propagates in the vacuum waveguide 72 in a direction perpendicular to an external magnetic field (in a direction indicated by an arrow B in FIG. 16), and is introduced into the plasma chamber 20. In this arrangement, the generation of plasma inside the vacuum waveguide 72 is a problem. However, the plasma generation inside the vacuum waveguide 72 can be prevented because the vacuum waveguide 72 is coupled to the plasma chamber 20 such that the propagating direction of a microwave is perpendicular to the external magnetic field and the microwave electric field is parallel to the external magnetic field. In addition, the diffusion of plasma into the vacuum waveguide 72 is also prevented by using the property of plasma that it is captured by lines of magnetic force and therefore does not diffuse easily in a direction perpendicular to the lines of magnetic force (Jpn. J. Appl. Phys. 28 (1989) L503–L506 "A Few Techniques for Preparing Conductive Material Films for Sputtering-Type Electron Cyclotron Resonance Microwave Plasma" by Morito Matsuoka and Ken'ichi Ono).

In this arrangement, however, a microwave propagates as an orthogonal wave (one of propagation modes of a microwave in plasma, in which the propagating direction of a microwave is perpendicular to an external magnetic field and the direction of an electric field is parallel to the external magnetic field) in the plasma chamber 20. Therefore, a cut-off phenomenon of a microwave cannot be avoided, and this causes reflection of a microwave to lead to a low plasma density.

That is, plasma can be generated easily when (a) an appropriate vacuum is realized, (b) an external magnetic field is present in a direction perpendicular to a microwave electric field, and (c) a microwave electric field is present. Plasma becomes difficult to generate when at least one of these conditions is not established. To stably generate high-density ECR plasma, on the other hand, it is necessary to satisfy the following three conditions at the same time: (d) a microwave is introduced into a plasma chamber along an external magnetic field from the side having a magnetic field higher than the ECR condition in order to prevent cut-off of the microwave; (e) the direction of a microwave electric field is perpendicular to that of the external magnetic field; and (f) an appropriate vacuum is realized.

In the vacuum waveguide, a proper vacuum is maintained and a microwave electric field exists. To prevent the generation of plasma in the vacuum waveguide, therefore, the microwave electric field may be set to be parallel to the external magnetic field, or the external magnetic field may be set to 0.

In the arrangement shown in FIG. 15, the generation of plasma inside the vacuum waveguide 72 is avoided by weakening the magnetic field inside the vacuum waveguide 72. If, however, plasma diffuses into the waveguide 72, the cut-off phenomenon of a microwave occurs because of the weak magnetic field, resulting in a low plasma density. In the arrangement shown in FIG. 16, on the other hand, the generation of plasma is suppressed by coupling the vacuum waveguide 72 to the side surface of the plasma chamber 20 so that the microwave electric field is parallel to the external magnetic field. However, the cut-off phenomenon of a microwave takes place in the plasma chamber 20 to make it difficult to increase the plasma density.

In the arrangement shown in FIG. 17, an RF power source 81 is used to supply radio-frequency power (RF power) to the microwave introducing window 27. That is, Ar gas is introduced into the plasma chamber 20 and converted into plasma, and the RF power is supplied from the RF power source 81 to the microwave introducing window 27. This generates a self-bias, and Ar ions in the plasma are accelerated and collided against the microwave introducing window 27 by the self-bias generated. The consequent sputtering effect of the Ar ions prevents deposition of conductive films on the microwave introducing window 27 (Preparation of TiN films by Electron Cyclotron Resonance Plasma Chemical Vapor Deposition. Takashi Akahori, Akira Tanihara and Masashi Tano: Japanese Journal Of Applied Physics Vol. 30, No. 12B, December, 1991, pp. 3558–3561).

In this arrangement, however, the collision of Ar ions poses a problem of damage to the microwave introducing window 27, and this results in a problem of mixing of impurity materials into films to be formed. In addition, it is necessary to additionally provide a cooling mechanism for preventing the temperature rise of the microwave introducing window 27 and a means for supplying an RF power to the microwave introducing window 27.

An arrangement in which a microwave is introduced obliquely to the central axis of lines of magnetic force by using one or more waveguides in order that no plasma particles fly directly to the microwave introducing window is also known to those skilled in the art. As an example, Japanese Patent Laid-Open No. 61-281883 has proposed a similar arrangement although the purpose of the arrangement is different. In such an arrangement, however, an electric field component perpendicular to a magnetic field is unavoidably generated regardless of whether the waveguide is of a TE mode or a TM mode. In addition, the above literature does not mention the magnetic field strength at the position of the microwave introducing window. However, in attempting to form a magnetic field meeting the ECR condition inside the plasma chamber in the arrangement disclosed in the above literature, the magnetic field strength at the position of the microwave introducing window becomes lower than the ECR condition. As a result, the ECR condition is formed in a vacuum portion of the waveguide between the microwave introducing window and the plasma chamber. In this arrangement, therefore, plasma is undesirably generated inside the waveguide, and consequently a microwave becomes difficult to introduce to the ECR point inside the plasma chamber. This makes efficient plasma generation impossible.

SUMMARY OF THE INVENTION

It is, therefore, a principal object of the present invention to provide a plasma processing apparatus capable of forming conductive films stably over long periods of time.

It is another object of the present invention to provide a plasma processing apparatus capable of generating a high-density plasma.

In order to achieve the above objects of the present invention, there is provided a plasma processing apparatus comprising a plasma chamber having a microwave introducing hole, microwave supplying means, first microwave guiding means for guiding a microwave from the microwave supplying means, second microwave guiding means for guiding the microwave to the microwave introducing hole upon receiving an output from the first microwave guiding means, and external magnetic field supplying means for supplying a magnetic field to the plasma chamber, wherein the second microwave guiding means has at least one vacuum waveguide with a dielectric window and an opening being formed on the side of the microwave introducing hole, the vacuum waveguide being arranged at a position where the external magnetic field applied from the external magnetic field supplying means is stronger than an ECR condition, and causing the microwave guided from the first microwave guiding means to propagate through the dielectric window in a direction perpendicular to the external magnetic field such that the electric field of the microwave is parallel to the external magnetic field applied to the second microwave guiding means by the external magnetic field supplying means, the dielectric window is arranged at a position at which at least a portion of the dielectric window cannot been seen directly from the microwave introducing hole, and the propagating direction of the microwave is changed at a position immediately above the plasma chamber, at which the external magnetic field strength is higher than the ECR condition, thereby introducing, through the opening, the microwave to the microwave introducing hole along the external magnetic field, whereby converting a raw material in the plasma chamber into plasma by electron cyclotron resonance (ECR).

DETAILED DESCRIPTION OF THE PREFERRED EMBODIMENTS

Plasma processing apparatuses according to the present invention will be described in detail below.

Embodiment 1

Figure 1:
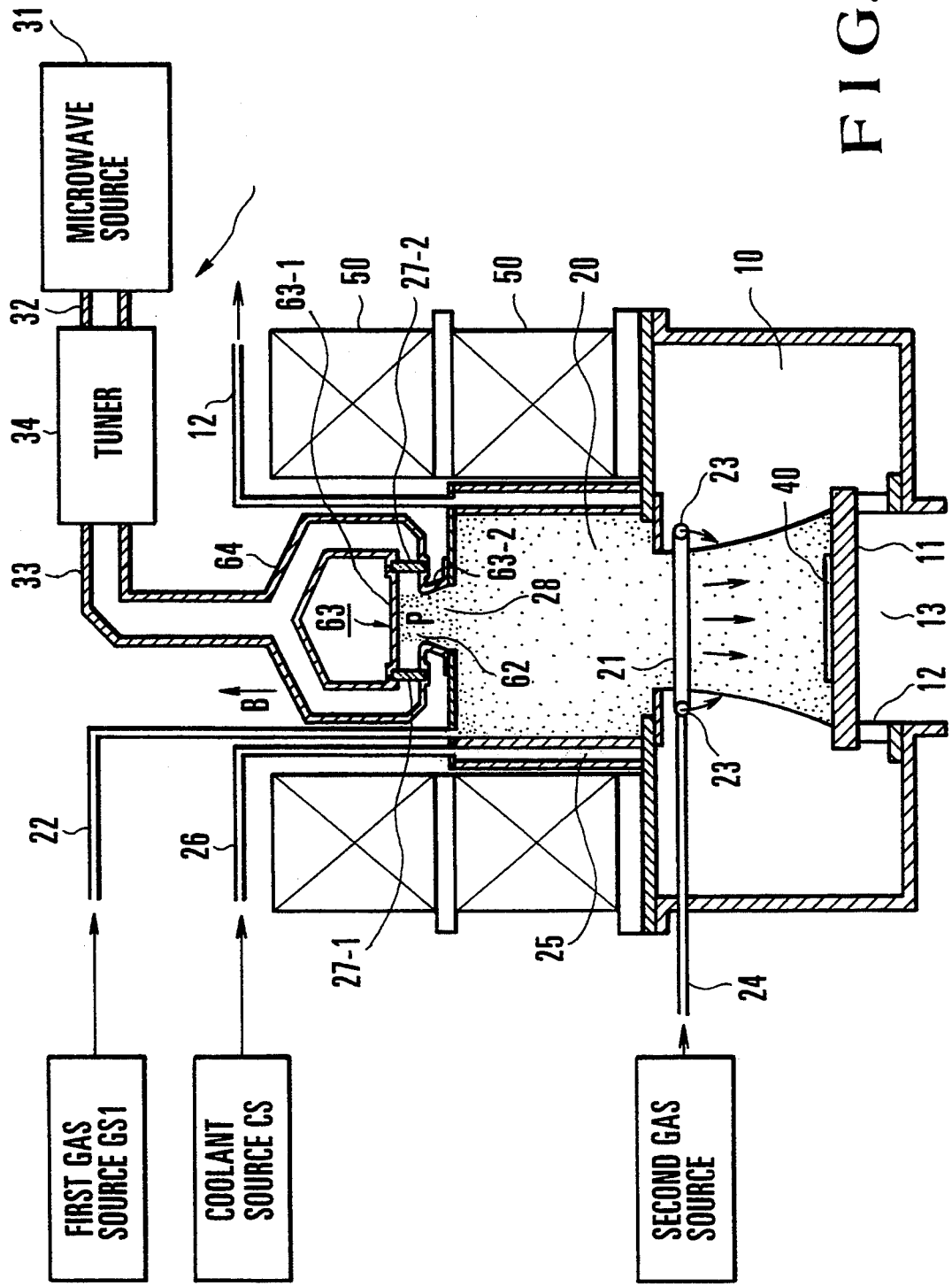
FIG. 1 is a view showing the first embodiment of a plasma processing apparatus according to the present invention.
Figure 2:
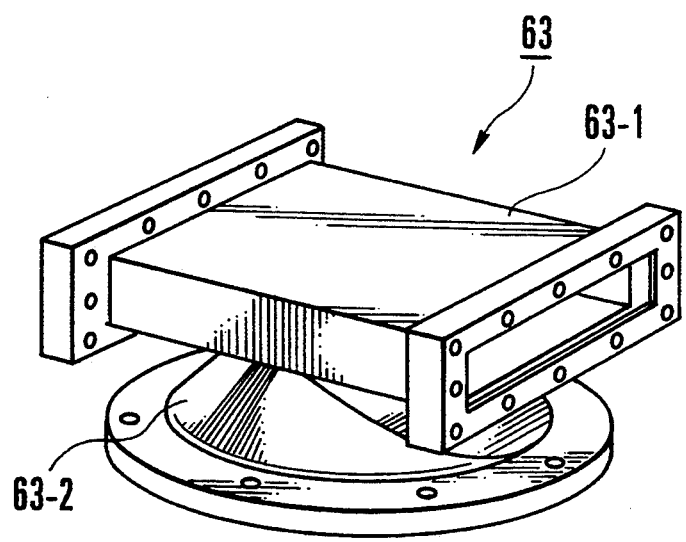
FIG. 2 is a perspective view showing the outer appearance of a vacuum waveguide shown in FIG. 1.

FIGS. 1 and 2 show an embodiment of a plasma processing apparatus according to the present invention, in which the same reference numerals as in the conventional arrangements described above denote the same parts.

Referring to FIGS. 1 and 2, a microwave from a microwave source 31 is introduced into a plasma chamber 20 through a rectangular waveguide 32, a tuner 34, a rectangular waveguide 33, a waveguide 64 which is divided into two portions, a microwave introducing window 27, and a vacuum waveguide 63. The waveguide 64 used herein is a rectangular waveguide for dividing a microwave into two components, which is a dividing circuit called an E-plane Y-divider in a microwave circuit. The T-shaped vacuum waveguide 63 has an opening 62 for supplying a microwave at its central portion. The vacuum waveguide 63 is constituted by a waveguide unit 63-1, in which a microwave propagates in a direction perpendicular to an external magnetic field B such that the microwave electric field is parallel to the external magnetic field B, and a tapered pipe unit 63-2 for introducing this microwave into the plasma chamber 20 along the external magnetic field B.

The opening 62 is formed to have a rectangular shape in the surface of the waveguide unit 63-1 on the side of the plasma chamber 20. In this embodiment, the rectangular opening 62 has dimensions of 40 mm, in the propagating direction of a microwave, and 96 mm, in a direction perpendicular to the propagating direction.. The tapered pipe unit 63-2 is arranged between the opening 62 and a microwave introducing hole 28 of the plasma chamber 20. In this embodiment, the tapered pipe unit 63-2 has a rectangular opening with dimensions of 96 mm×40 mm, on the side of the waveguide unit 63-1, and a circular opening 96 mm in diameter, which is equal to the length of in the longitudinal direction of the waveguide unit 63-1, on the side of the plasma chamber 20. Reference numerals 27-1 and 27-2 denote microwave introducing windows for introducing microwaves while maintaining vacuum. The microwave introducing windows 27-1 and 27-2 are arranged on the two sides of the opening 62, on both the sides of which microwaves propagate perpendicularly to the external magnetic field. In this embodiment, the microwave introducing windows 27-1 and 27-2 consist of quartz plates.

A microwave from the microwave source 31 is introduced to the dividing circuit 64 through the rectangular waveguide 32, the tuner 34, and the rectangular waveguide 33 and divided into two components by the dividing circuit 64. These two microwaves propagate equal distances and reach a portion near the opening 62 through the microwave introducing windows 27-1 and 27-2. Since the phases of the electric fields of the two microwaves divided by the dividing circuit 64 differ from each other by 180 degrees, the electric field of the microwave from the microwave introducing window 27-1 and the microwave from the microwave introducing window 27-2 cancel each other in the vicinity of the opening 62 of the waveguide unit 63-1, so that the node of a standing-wave forms near the opening 62. This extremely weakens the strength of a microwave electric field.

In this case, arranging the microwave introducing windows 27-1 and 27-2 symmetrically with respect to the opening 62 allows the two microwaves divided by the dividing circuit 64 to have perfectly equal optical path lengths. This can form the node near the opening 62 more effectively.

Figure 3:
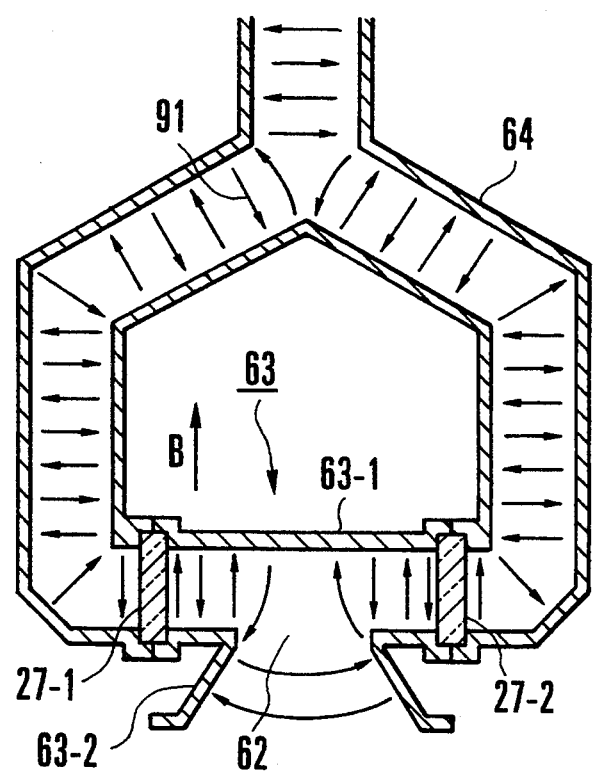
FIG. 3 is a view showing a microwave propagating state inside the vacuum waveguide according to the first embodiment.

The flow of microwave energy, on the other hand, is represented by a poynting vector. On the left and right sides of the confluent point of microwaves in the waveguide unit 63-1, the microwave electric fields have opposite phases, and the microwaves propagate in directions opposite to each other. Therefore, the microwave magnetic fields have the same phase and enhance each other at the confluent point. The resultant microwave magnetic field induces a microwave, and the microwave thus induced is radiated into the plasma chamber 20. The electric field of this microwave radiated has a component perpendicular to the external magnetic field. FIG. 3 shows this phenomenon. In FIG. 3, reference numeral 91 denotes schematically lines of electric force of a microwave.

In this embodiment, the rectangular waveguide 33 is arranged such that the propagating direction of a microwave is perpendicular to the external magnetic field and the microwave electric field is parallel to the external magnetic field immediately before the microwave introducing window 27. To realize this, the rectangular waveguide 33 is bent at a right angle to form an E corner immediately before the microwave introducing window 27. With this arrangement, the magnetic field strength near the vacuum waveguide 63 is enhanced to be higher than the ECR condition by a magnetic coil 50, generating an external magnetic field which satisfies the ECR condition in an appropriate area in the plasma chamber 20.

With the above arrangement, the microwave electric field is parallel to the external magnetic field B in the waveguide unit 63-1, and the node of a standing-wave is formed near the opening 62 to extremely weaken the microwave electric field, preventing plasma generation in the waveguide unit 63-1. In addition, since the microwave is introduced into the plasma chamber 20 along the external magnetic field B from the side having a higher magnetic field than the ECR condition, no cutoff phenomenon of the microwave occurs in the plasma chamber 20. As a result, a high-density plasma can be generated stably.

Where there is a magnetic field, electrons are subjected to a Lorentz force and hence move around lines of magnetic force. Consequently, it becomes difficult for the electrons to move in a direction perpendicular to the lines of magnetic force. Since the waveguide unit 63-1 of the vacuum waveguide 63 is so arranged as to be perpendicular to the magnetic field, electrons in the plasma chamber 20 very rarely diffuse into the waveguide unit 63-1. In addition, even if electrons exit in the waveguide unit 63-1, since the waveguide unit 63-1 is a waveguide of a TE mode in which the internal microwave electric field is parallel to the external magnetic field generated by the magnetic coil 50, the electrons accelerated by the microwave electric field reach the wall of the waveguide immediately, and this avoids easy occurrence of a plasma discharge. It is experimentally confirmed that no plasma discharge takes place when a microwave power is 1 kW or less on the order of $10^{-4}$ Torr.

The microwaves divided by the dividing circuit 64 pass through their respective corresponding microwave introducing windows 27-1 and 27-2, propagate in the waveguide unit 63-1 of the vacuum waveguide 63 in a direction perpendicular to the external magnetic field generated by the magnetic coil 50, and meet each other again in the vicinity of the opening 62. At this time, as described above, the microwave electric fields cancel each other, whereas the microwave magnetic fields enhance each other. The consequent microwave magnetic field again induces a microwave, and the microwave thus induced propagates toward the plasma chamber 20 along the magnetic field. In this case, if a portion which satisfies the ECR condition exists in the vacuum waveguide 63, the introduction of the microwave into the plasma chamber 20 is interfered. In this embodiment, therefore, the magnetic field strength in the vacuum waveguide 63 is enhanced to be higher than the ECR condition in order that no ECR occurs in that portion. This arrangement also enables the microwave to be introduced into the plasma chamber along the magnetic field from the side having a stronger magnetic field than the ECR condition. Consequently, a high-density plasma can be generated efficiently.

The relationship between the plasma and the microwave in the above embodiment will be described in more detail below with reference to FIGS. 4 and 5.

Plasma can diffuse easily in a direction along a magnetic field. In the arrangement of the embodiment described above, therefore, plasma generated in the plasma chamber 20 diffuses to a portion near a point P through the microwave introducing hole 28. FIG. 4 shows an arrangement for examining the influence of the plasma thus diffusing. Referring to FIG. 4, reference numerals 130 and 131 denote power monitors for detecting the power of a microwave propagating in the waveguide 63-1 in the respective propagating directions; and 132, a nonreflecting termination. This arrangement can examine the ratios of a microwave M1 reflected toward the microwave source side and a microwave M2 transmitting through the plasma portion P with respect to an incident microwave M0 and can also examine the relationship with an ion current in the plasma chamber 20 at that time. The plasma portion P represents plasma which diffuses from the plasma chamber 20 into the waveguide 63-1 through the microwave introducing hole 28.

Figure 4:
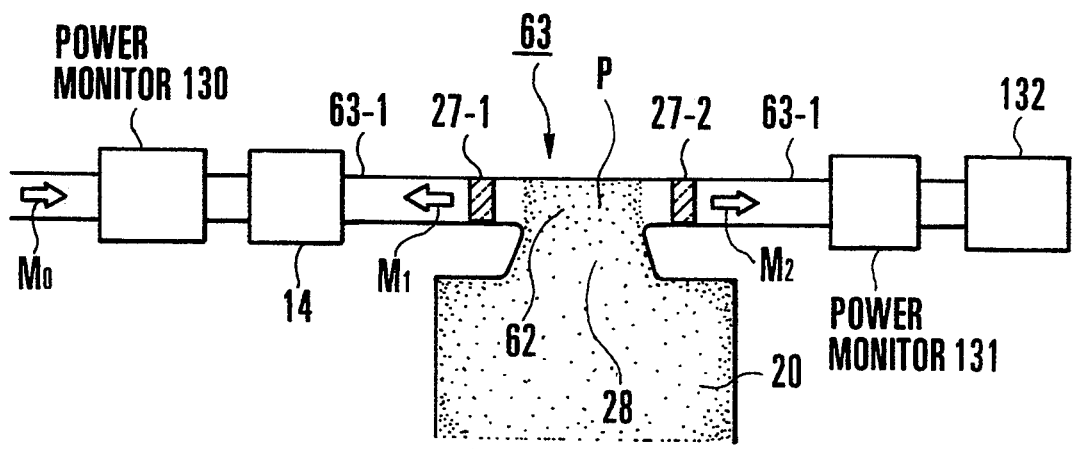
FIG. 4 is a view showing an arrangement for examining the influence of plasma diffused in the embodiment shown in FIG. 1.
Figure 5:
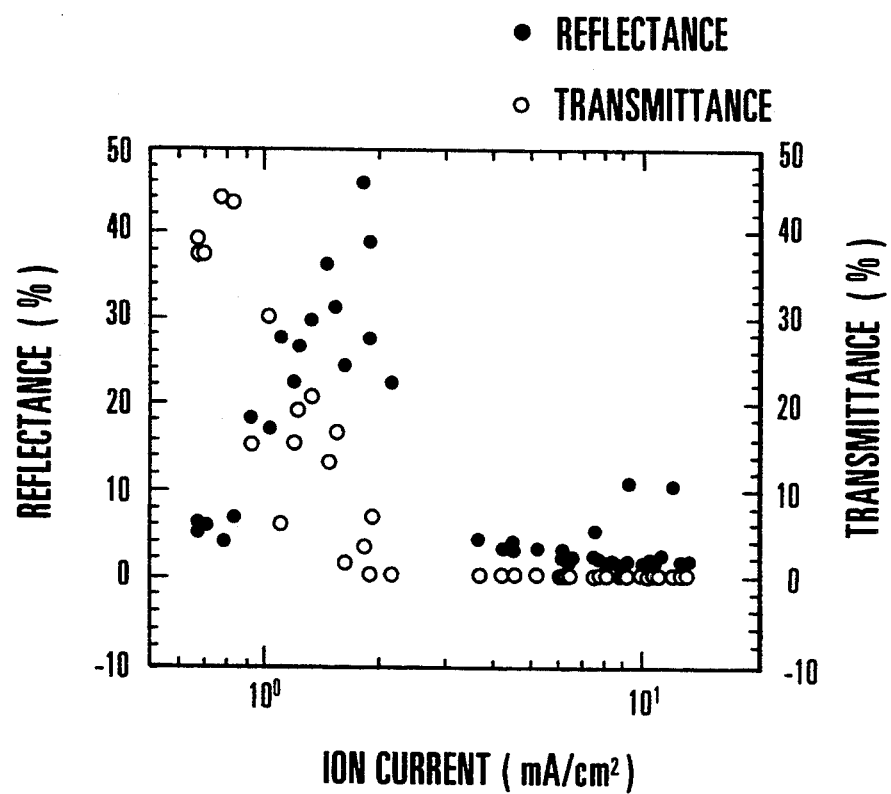
FIG. 5 is a graph showing the relationship between the ion current, the reflectance, and the transmittance in the embodiment shown in FIG. 1.

The arrangement shown in FIG. 4 cannot reproduce the condition shown in FIG. 1 perfectly because a microwave is introduced from only the microwave introducing window 27-1. It is, however, possible to consider the propagation of a microwave in FIG. 1 through this arrangement.

The incident microwave M0 from the microwave source 31 reaches the plasma portion P through the microwave introducing window 27-1. The incident microwave power and the reflected microwave power are detected by the power monitor 130. The microwave M2 (transmitted microwave), on the other hand, which is transmitted through the plasma portion P, is detected by the power monitor 131 and absorbed by the nonreflecting termination 132. FIG. 5 shows the measurement results, in which the ion current density measured in a specimen chamber 10 is plotted on the abscissa, and the ratios of the reflected microwave power and the transmitted microwave power to the incident microwave power are plotted on the ordinate. As shown in FIG. 5, a transmittance indicated by symbol O gradually decreases as the ion current increases and becomes 0 when the ion current is 2 mA/cm² or more. A reflectance indicated by symbol ●, on the other hand, increases with the increase in ion current but abruptly decreases when the ion current is 2 mA/cm² at which the transmittance is 0. Thereafter, the reflectance almost remains the same. The ion current in the specimen chamber 10 corresponds to the plasma density in the plasma chamber 20.

The above measurement results demonstrate that when the density of plasma diffusing to the point P increases as the plasma density in the plasma chamber 20 increases, the microwave is reflected near the plasma portion P. When the microwave is reflected near the plasma portion P, therefore, the node of a microwave electric field and the antinode of a microwave magnetic field are formed near the point P, the microwave is reflected efficiently from that point toward the plasma chamber 20. It is shown in FIG. 3 that a sufficiently dense plasma of over 2 mA/cm² is generated under condition of low reflection and low transmission. From this result, the propagation of microwaves in the arrangement shown in FIG. 1 can be considered as follows. First, when the plasma density is low enough to allow microwaves to transmit through plasma diffusing to the point P, microwaves passing through the microwave introducing windows 27-1 and 27-2 meet each other in the vicinity of the opening 62, forming the node of an electric field and the antinode of a magnetic field near the center of the opening 62. When, on the other hand, the plasma density is high and so microwaves cannot transmit through plasma diffusing to the point P, microwaves passing through the microwave introducing windows 27-1 and 27-2 are reflected by portions near the two sides of the diffusing plasma, forming the node of an electric field and the antinode of a magnetic field at those portions. It should be noted that the microwave is reflected by the diffusing plasma after propagating in the plasma to some extent which depends on the density of the plasma diffusing.

Collectively, the propagation of microwaves in the arrangement shown in FIG. 1 can be totally understood without regard to the plasma density assuming that two virtual reflecting planes perpendicular to the propagating direction of a microwave are present in the opening 62 and the distance between these two virtual reflecting planes increases with the plasma density. More specifically, the two virtual reflecting planes move to the center of the opening 62 when the plasma density is low; and move closer to the two ends of the opening 62 when the plasma density is high. The microwaves passing through the microwave introducing windows 27-1 and 27-2 are reflected by these two virtual reflecting planes to form the node of a microwave electric field and the antinode of a microwave magnetic field. Consequently, the microwave is reflected efficiently from that position toward the plasma chamber 20. The microwave reflected is a quasi-TM wave which can be tuned well with a quasi-TM wave as the propagation mode in the plasma chamber 20 when plasma is present in the chamber 20. This makes very efficient plasma generation possible.

In this embodiment, the microwave introducing windows 27-1 and 27-2 are located at positions at dead angles from the opening 28 for introducing a microwave into the plasma chamber 20. This prevents plasma particles generated in the plasma chamber 20 from flying directly to the microwave introducing windows 27-1 and 27-2, thereby enhancing the effect of avoiding deposition of films on the microwave introducing windows 27-1 to 27-2.

Embodiment 2

Figure 6:
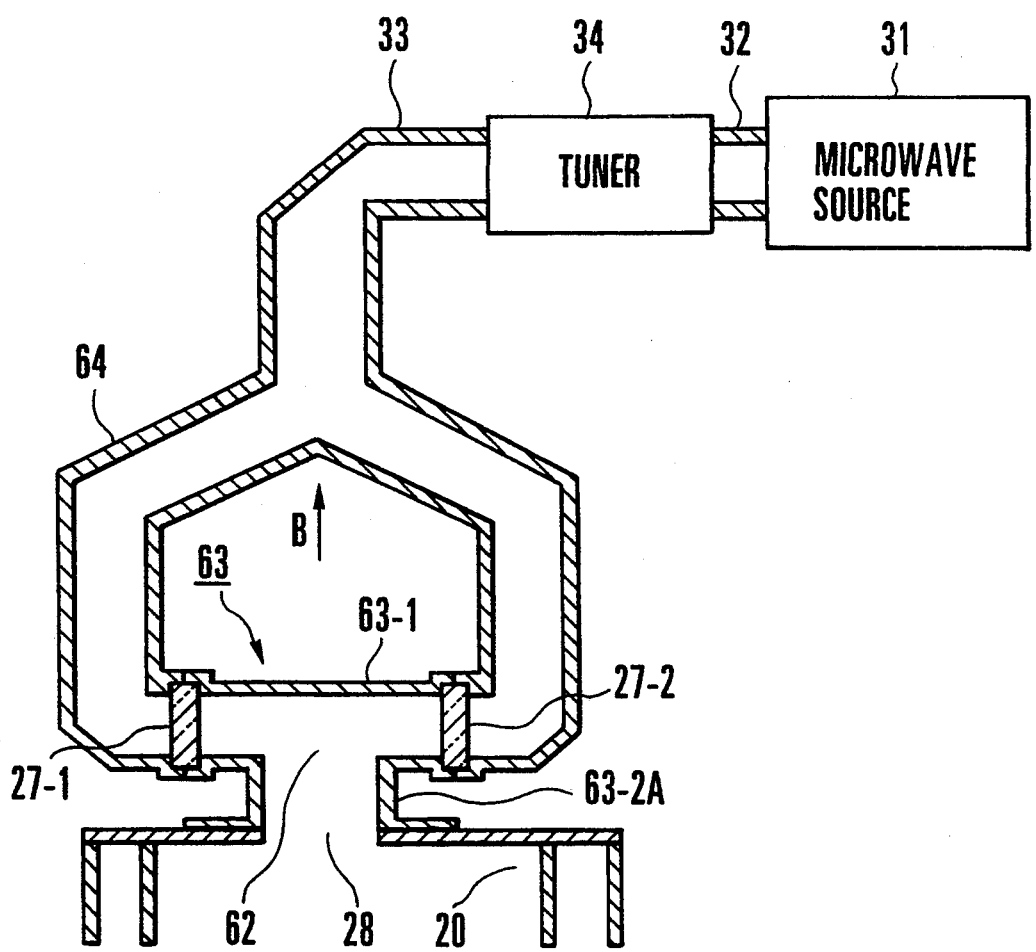
FIG. 6 is an enlarged view showing a microwave introducing unit of the second embodiment of a plasma processing apparatus according to the present invention.

FIG. 6 shows a modification of the first embodiment, in which the tapered pipe unit 63-2 constituting the vacuum waveguide 63 shown in FIG. 1 is formed into a rectangular or cylindrical connecting pipe unit 63-2A. This second embodiment also serves the same effects as in the first embodiment.

Embodiment 3

Figure 7:
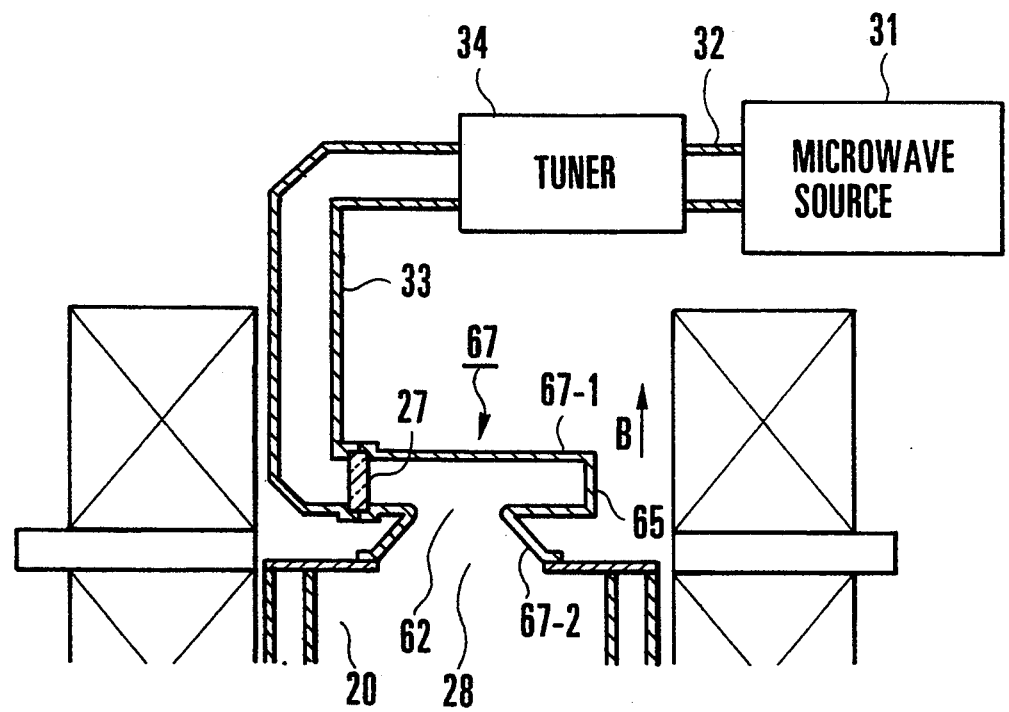
FIG. 7 is an enlarged view showing a microwave introducing unit of the third embodiment of a plasma processing apparatus according to the present invention.
Figure 8:
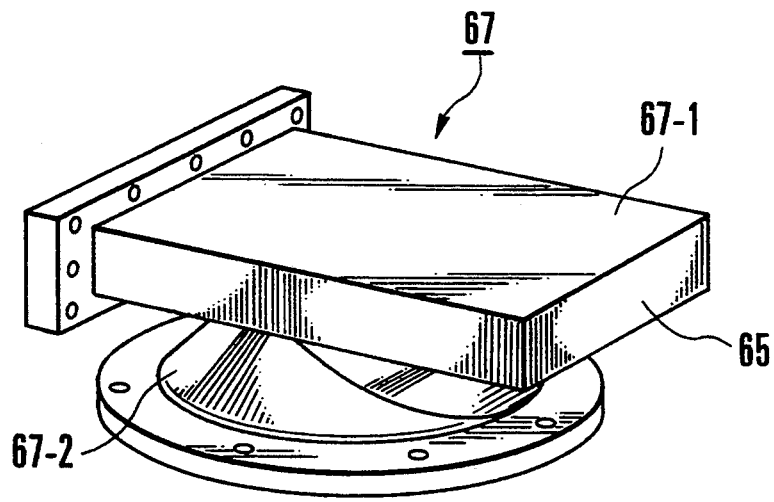
FIG. 8 is a perspective view showing the outer appearance of a vacuum waveguide shown in FIG. 7.

FIGS. 7 and 8 show the third embodiment of the present invention, in which particularly a microwave introducing unit is illustrated in an enlarged scale. The arrangements of other portions are the same as in FIG. 1.

Referring to FIGS. 7 and 8, reference numeral 67 denotes a vacuum waveguide having a reflecting termination 65 at its one end portion. The vacuum waveguide 67 is constituted by a waveguide unit 67-1, in which a microwave propagates in a direction perpendicular to an external magnetic field B such that the microwave electric field is parallel to the external magnetic field B, and a tapered pipe unit 67-2 for introducing this microwave into a plasma chamber 20 along the external magnetic field. An opening 62 is formed in the inner surface of the waveguide unit 67-1 on the side of the plasma chamber 20 so as to be centered at a position away from the reflecting termination 65 by a half-wavelength. In this embodiment, the opening 62 is a rectangular opening with dimensions of 40 mm, in the propagating direction of a microwave, and 96 mm, in a direction perpendicular the propagating direction. The tapered pipe unit 67-2 communicates with the opening 62. In this embodiment, the tapered pipe unit 67-2 has a rectangular opening with dimensions of 96 mm×40 mm, on the side of the waveguide unit 67-1, and a circular opening 96 mm in diameter, which is equal to the length in the longitudinal direction of the waveguide unit 67-1, on the side of the plasma chamber 20.

A microwave from a microwave source 31 is reflected by the reflecting termination 65 through a rectangular waveguide 32, a tuner 34, a rectangular waveguide 33, and a microwave introducing window 27 and interferes with a microwave propagating through the microwave introducing window 27, forming a standing-wave in the waveguide unit 67-1. Since the opening 62 is centered at the position apart from the reflecting termination 65 by a half-wavelength, the node of a standing-wave is formed in the vicinity of the opening 62, and consequently the strength of a microwave electric field becomes very weak. The magnetic fields, on the other hand, enhance each other to radiate the microwave into the tapered pipe unit 67-2. The radiated microwave is further radiated into the plasma chamber 20 through the tapered pipe unit 67-2. The electric field of the microwave thus radiated has a component perpendicular to the external magnetic field.

With the above arrangement, the microwave electric field is parallel to the external magnetic field in the waveguide unit 67-1, and the node of a standing-wave is formed in the vicinity of the opening 62 to yield a very weak microwave electric field. This makes it possible to prevent plasma generation in the waveguide unit 67-1. In addition, since the microwave is introduced into the plasma chamber 20 along the external magnetic field from the side with a magnetic field being higher than the ECR condition, no cut-off phenomenon of a microwave occurs in the plasma chamber 20. As a result, a high-density plasma can be generated stably.

In this embodiment, the microwave introducing window 27 is arranged at a position at a dead angle from an opening 28 for introducing a microwave into the plasma chamber 20. Therefore, plasma particles generated in the plasma chamber 20 cannot fly directly to the microwave introducing window 27. This prevents deposition of films on the microwave introducing window 27 more effectively.

In each of the above embodiments, CVD for supplying a raw material in the form of a gas has been described. The present invention, however, is also applicable to a sputtering process in which a metal target is additionally provided at a position, e.g., immediately below a plasma extracting opening 21 to supply a raw material in the form of a solid, as disclosed in "Electron Cyclotron Resonance Plasma Deposition Technique Using Raw Material Supply by Sputtering," Toshiro Ono, Chiharu Takahashi and Seitaro Matuo, JAPANESE JOURNAL OF APPLIED PHYSICS 23 (1984), pp. L534-L536. This arrangement can also provide the same effects as when a raw material is supplied in the form of a gas.

As is apparent from the above description, according to each embodiment of the present invention described above, a microwave passing through the dielectric window propagates in a direction perpendicular to an external magnetic field such that the microwave electric field is parallel to the external magnetic field. This avoids generation of plasma inside the waveguide and diffusion of plasma into the waveguide (i.e., cut-off of the microwave in the waveguide). In addition, the microwave is introduced into the plasma chamber while the propagating direction is bent at a right angle at a location immediately above the plasma chamber, at which the strength of an external magnetic field is higher than the ECR condition. As a result, cut-off of the microwave in the plasma chamber can be prevented. This basically solves the problem of deposition of films on the dielectric window to allow stable generation of a high-density plasma. Consequently, metal films, such as films of Al, Mo, W, Ti, and TiN, and conductive films, such as films of SiC and a-Si, can be stably formed over long periods of time.

Embodiment 4

Figure 9:
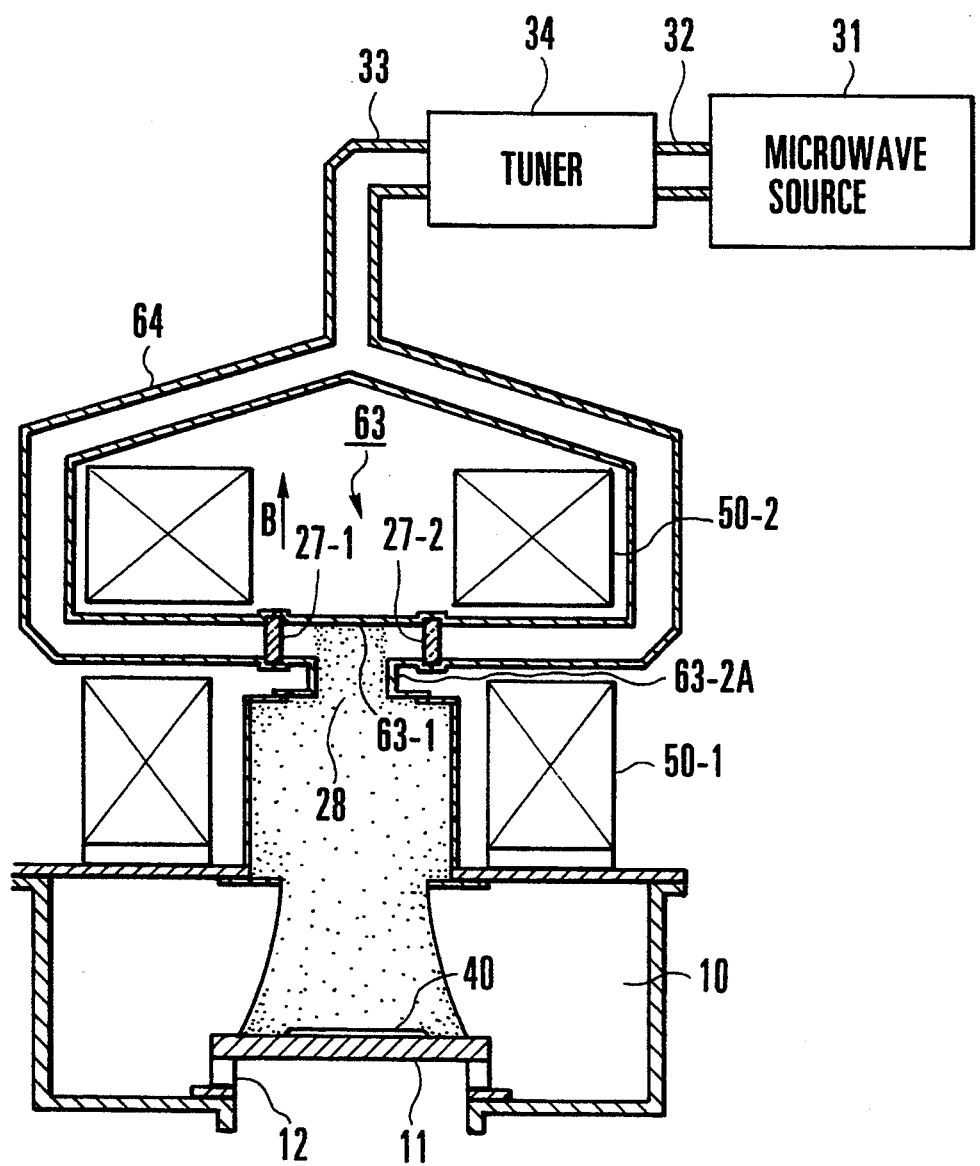
FIG. 9 is a view showing the fourth embodiment of a plasma processing apparatus according to the present invention.

FIG. 9 shows a modification of the embodiment shown in FIG. 6, in which a magnetic coil 50 is constituted by two magnetic coils 50-1 and 50-2, and waveguides divided by a dividing circuit 64 are connected to microwave introducing windows 27-1 and 27-2 through portions between the magnetic coils 50-1 and 50-2. With this arrangement, the distance between the microwave introducing windows and plasma is increased to prevent deposition of conductive films on the microwave introducing windows more effectively.

Embodiment 5

Figure 10:
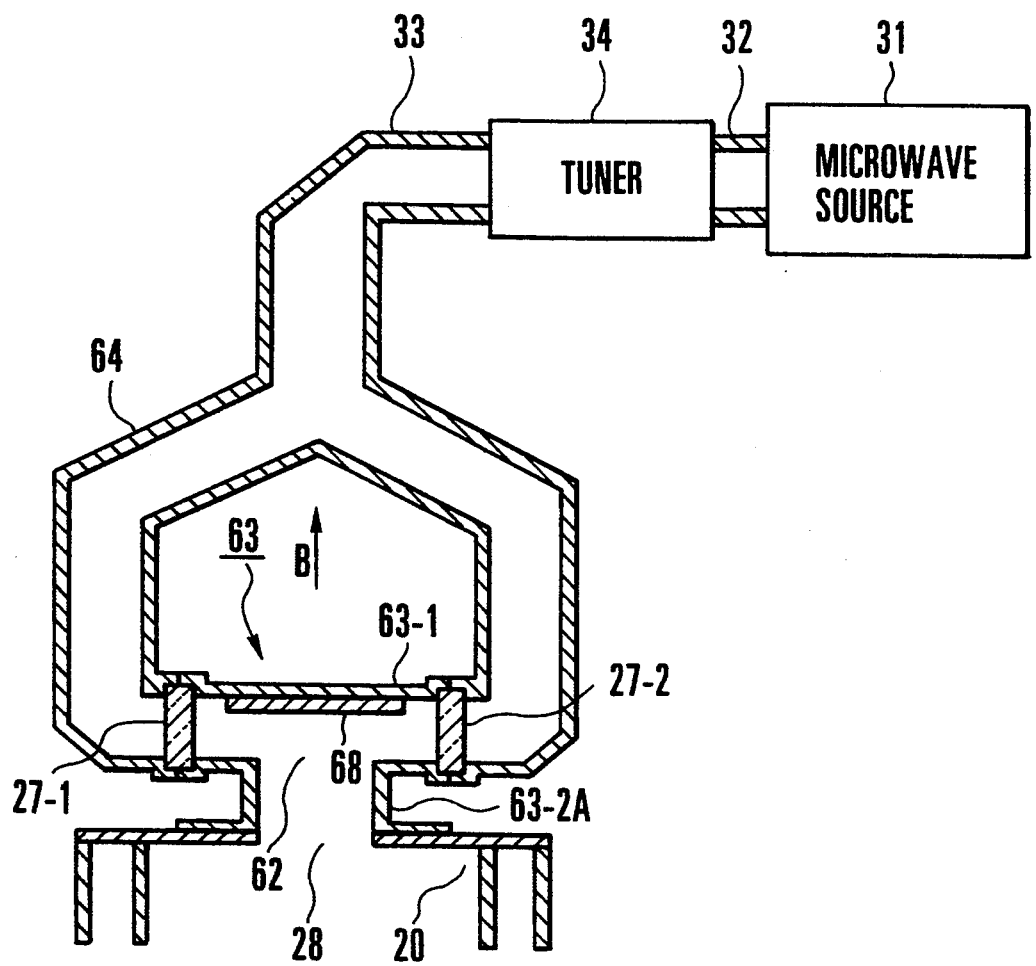
FIG. 10 is an enlarged view showing a microwave introducing unit of the fifth embodiment of a plasma processing apparatus according to the present invention.

Since plasma can diffuse in a direction along lines of magnetic force, charged particles of plasma are incident on the surface of a vacuum waveguide 63, which opposes an opening 62. When this surface of the vacuum waveguide 63 opposing the opening 62 is insulated from the ground potential, a plasma sheath is formed to prevent the incidence of charged particles of plasma. As a result, electrons having lost from plasma unless insulation is performed again return to plasma to contribute to plasma generation, and this further increases the plasma density. FIG. 10 shows an arrangement in which an insulator 68 consisting of, e.g., a quartz plate or alumina is located on the surface of the vacuum waveguide 63 which opposes the opening 62, thereby insulating that portion from the ground potential.

Embodiment 6

Figure 11:
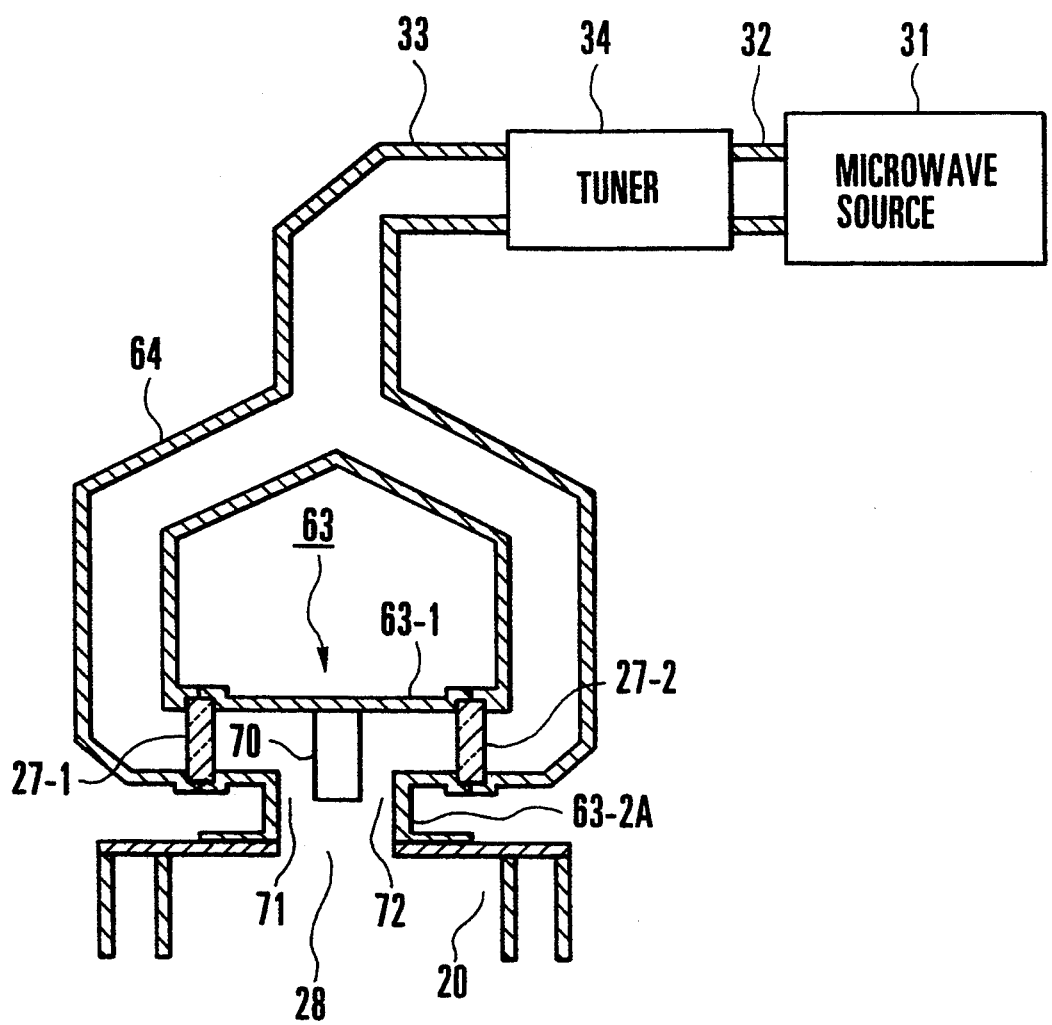
FIG. 11 is an enlarged view showing a microwave introducing unit of the sixth embodiment of a plasma processing apparatus according to the present invention.

FIG. 11 shows another modification of the embodiment shown in FIG. 6, in which the same reference numerals as in the embodiment shown in FIG. 6 denote the same parts and a detailed description thereof will be omitted. Note that although this embodiment employs a straight connecting pipe unit, it is, of course, possible to use a tapered connecting pipe unit.

The characteristic portion of this embodiment is a reflecting plate 70. This reflecting plate 70 is arranged on the pipe wall of a rectangular waveguide unit 63-1 of a vacuum waveguide 63, which opposes a connecting pipe unit 63-2A, so as to suspend vertically from the pipe wall into an opening of the connecting pipe unit 63-2A, i.e., into a microwave introducing hole 28. Reference numerals 71 and 72 denote introducing holes communicating with the microwave introducing hole 28, which are defined between the reflecting plate 70 and the inner walls of the connecting pipe unit 63-2A. As in the embodiment mentioned earlier, microwave introducing windows 27-1 and 27-2 are arranged at positions to which no plasma particles can fly directly, i.e., at positions at dead angles from a plasma chamber 20, particularly from the microwave introducing hole. This makes it possible to prevent ions or neutral particles in the plasma chamber 20 from being incident directly on the microwave introducing windows 27-1 and 27-2 during formation of conductive films, preventing deposition of the conductive films on the microwave introducing windows 27-1 and 27-2. This avoids an inconvenience that a microwave is reflected or absorbed by a conductive film to make plasma generation impossible or unstable.

In this arrangement, a microwave from a microwave source 31 is guided to a dividing circuit 64 through a rectangular waveguide 32, a tuner 34, and a rectangular waveguide 33 and divided into two components by the dividing circuit 64. After propagating equal distances in their respective rectangular waveguides, these two microwaves reach the reflecting plate 70 through the microwave introducing windows 27-1 and 27-2 and are reflected by the plate 70. In this case, the node of a microwave electric field is formed in the vicinity of the surface of the reflecting plate 70, and this weakens the microwave electric field but strengthens the microwave magnetic field. A microwave is induced by this microwave magnetic field and radiated into the plasma chamber 20 through the introducing holes 71 and 72. The microwave thus radiated is a quasi-TM wave which can be tuned well with a quasi-TM wave as the propagation mode in the plasma chamber 20 when plasma is present in the chamber 20. Therefore, plasma generation can be performed very efficiently.

In this arrangement, in the waveguide unit 63-1 of the vacuum waveguide, the electric fields cancel each other and the magnetic fields enhance each other in the vicinity of the reflecting plate 70. This is so because components of an electric field parallel to the surface of a metal must be zero on the metal surface, and consequently the electric fields of an incident microwave and a reflected microwave have opposite phases. On the other hand, since the propagating directions of the incident microwave and the reflected microwave also oppose each other, the magnetic fields of these two microwaves have the same phase. As a result, in a standing-wave formed in front of the reflecting plate, the antinode of a magnetic field forms where the node of an electric field forms, and the node of a magnetic field forms where the antinode of an electric field forms.

In addition, since the radiation point of a microwave is maintained constant regardless of the plasma density, plasma can be stably generated independently of the plasma density. Furthermore, since the radiation position of a microwave can be adjusted by adjusting the thickness or the position of the reflecting plate, the homogeneity of plasma can be controlled easily.

Embodiment 7

Figure 12:
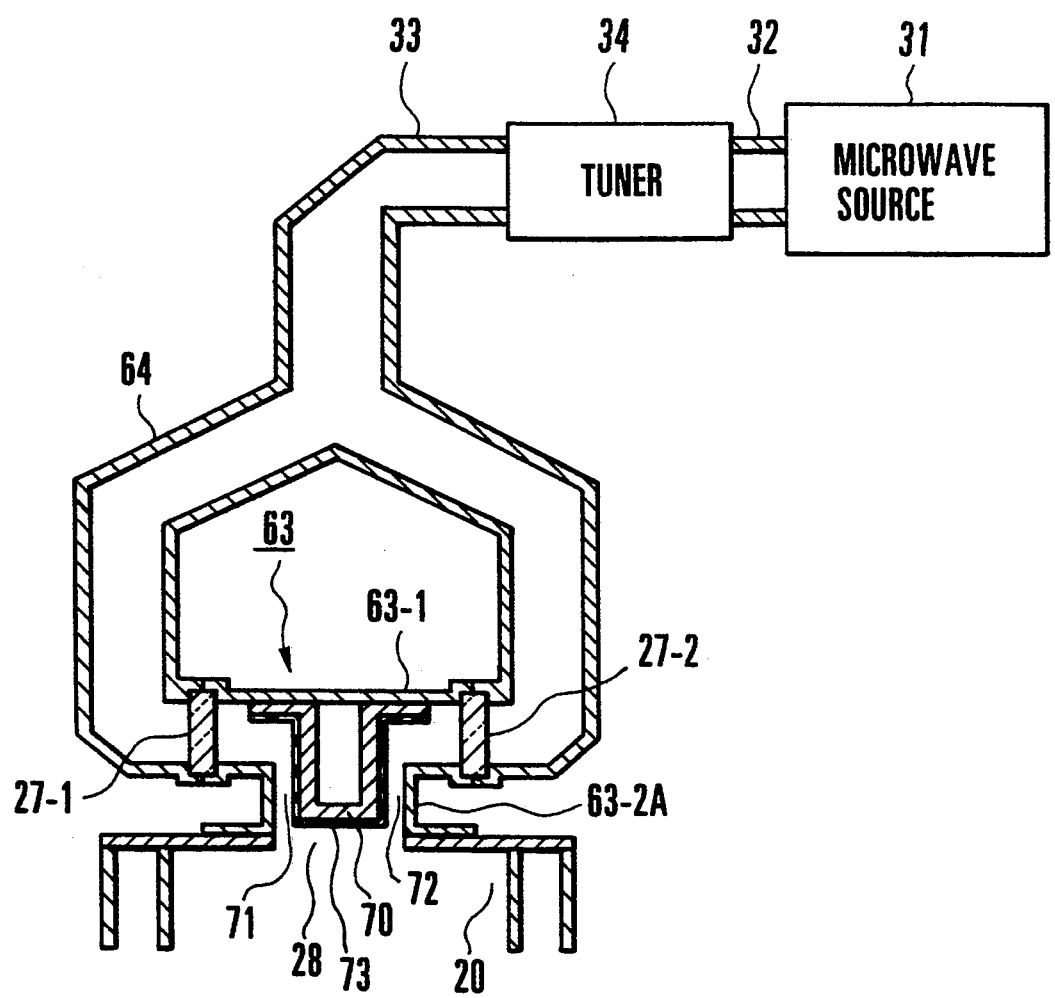
FIG. 12 is an enlarged view showing a microwave introducing unit of the seventh embodiment of a plasma processing apparatus according to the present invention.

FIG. 12 shows an arrangement in which the surface of a vacuum waveguide 63, which opposes an opening 62, and the surface of a reflecting plate are covered with an insulator 73, such as alumina, and are thereby insulated from the ground potential. Therefore, electrons having lost from plasma unless insulation is performed return again to plasma, contributing to plasma generation. This further increases the plasma density.

Embodiment 8

Figure 13:
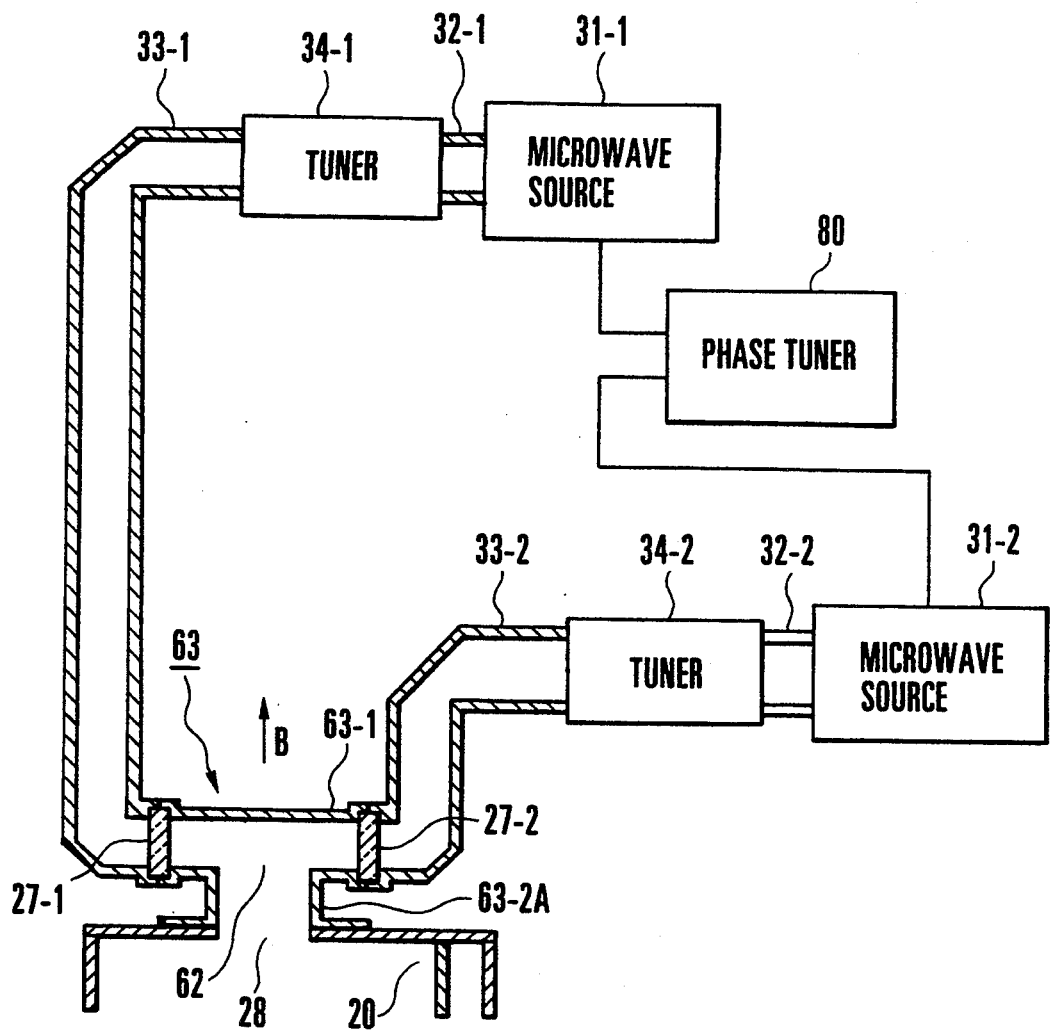
FIG. 13 is an enlarged view showing a microwave introducing unit of the eighth embodiment of a plasma processing apparatus according to the present invention.
Figure 14:
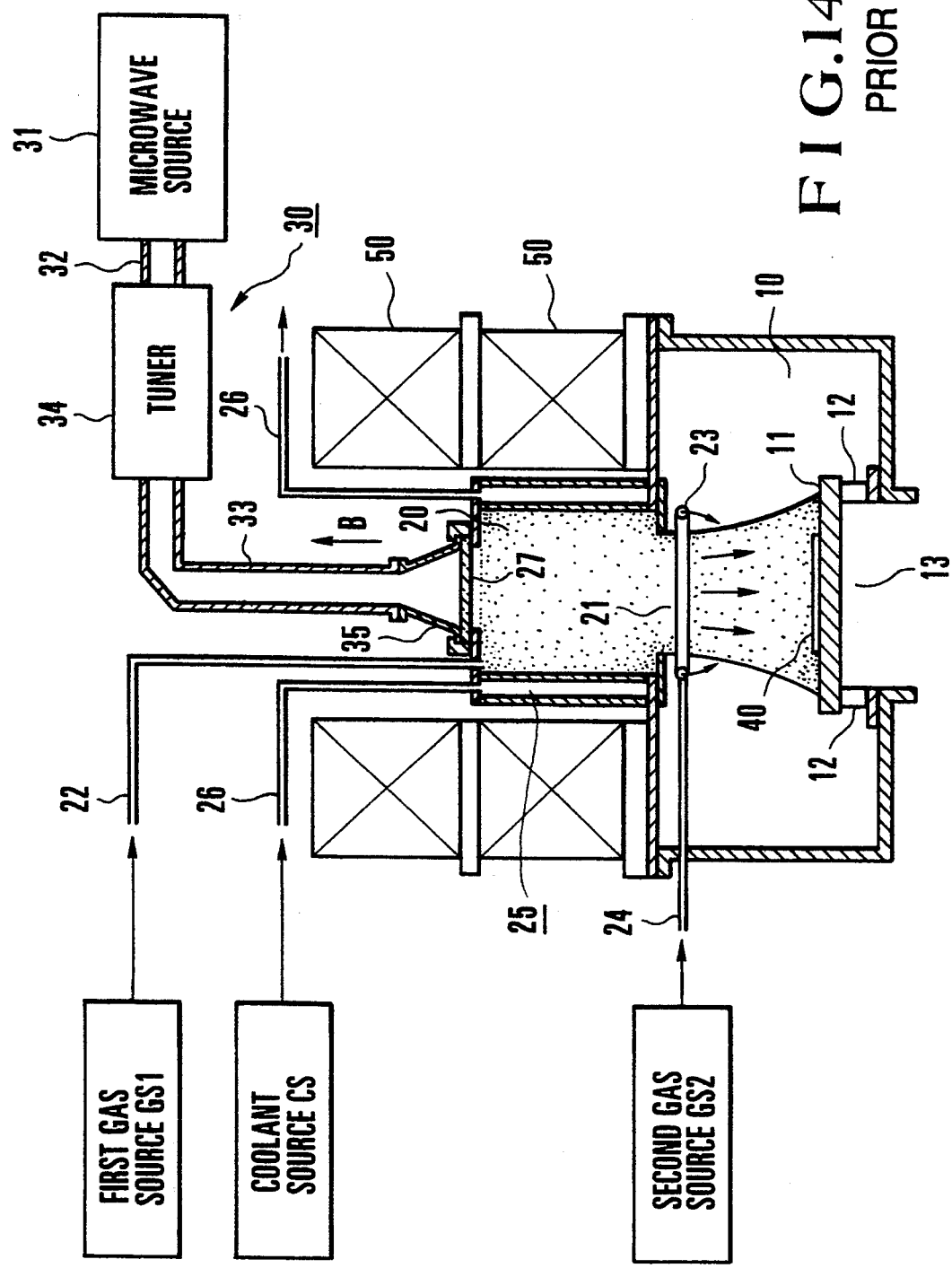
FIG. 14 is a view showing the basic arrangement of a conventional plasma processing apparatus using ECR.
Figure 15:
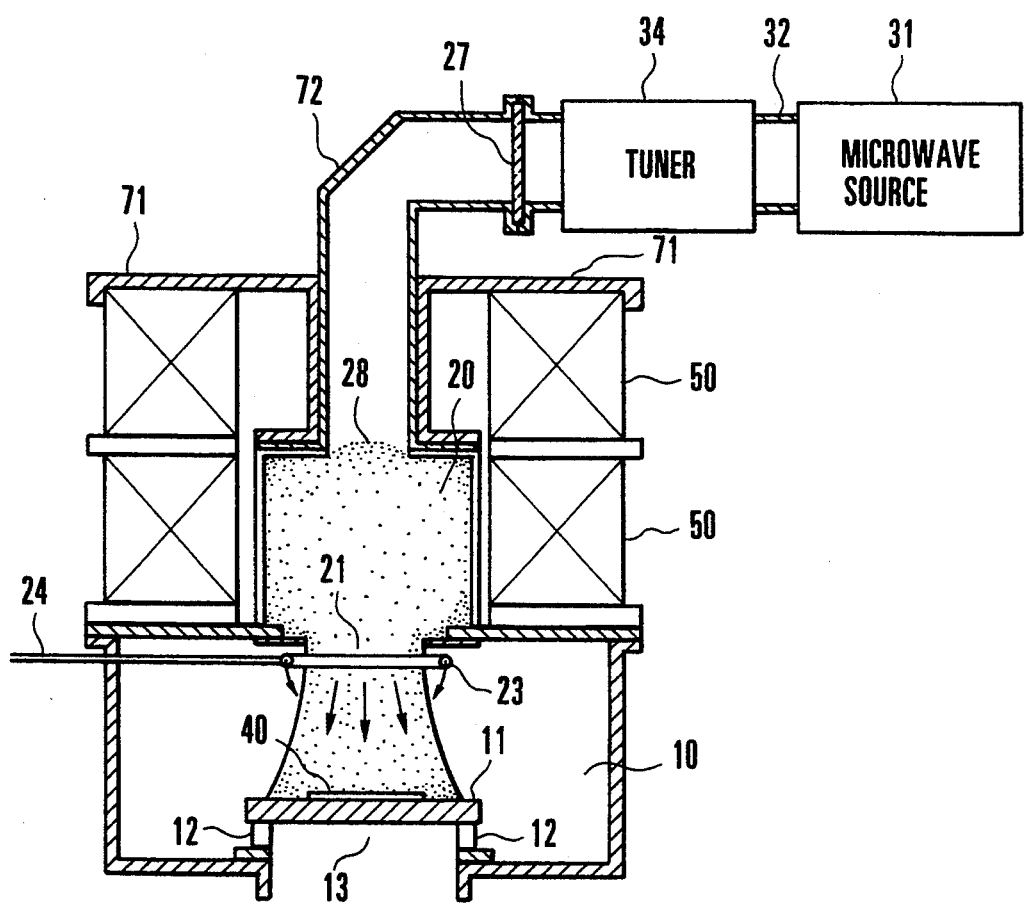
FIG. 15 is a view showing the basic arrangement of a conventional plasma processing apparatus manufactured by taking into account deposition of conductive films on a microwave introducing window.
Figure 16:
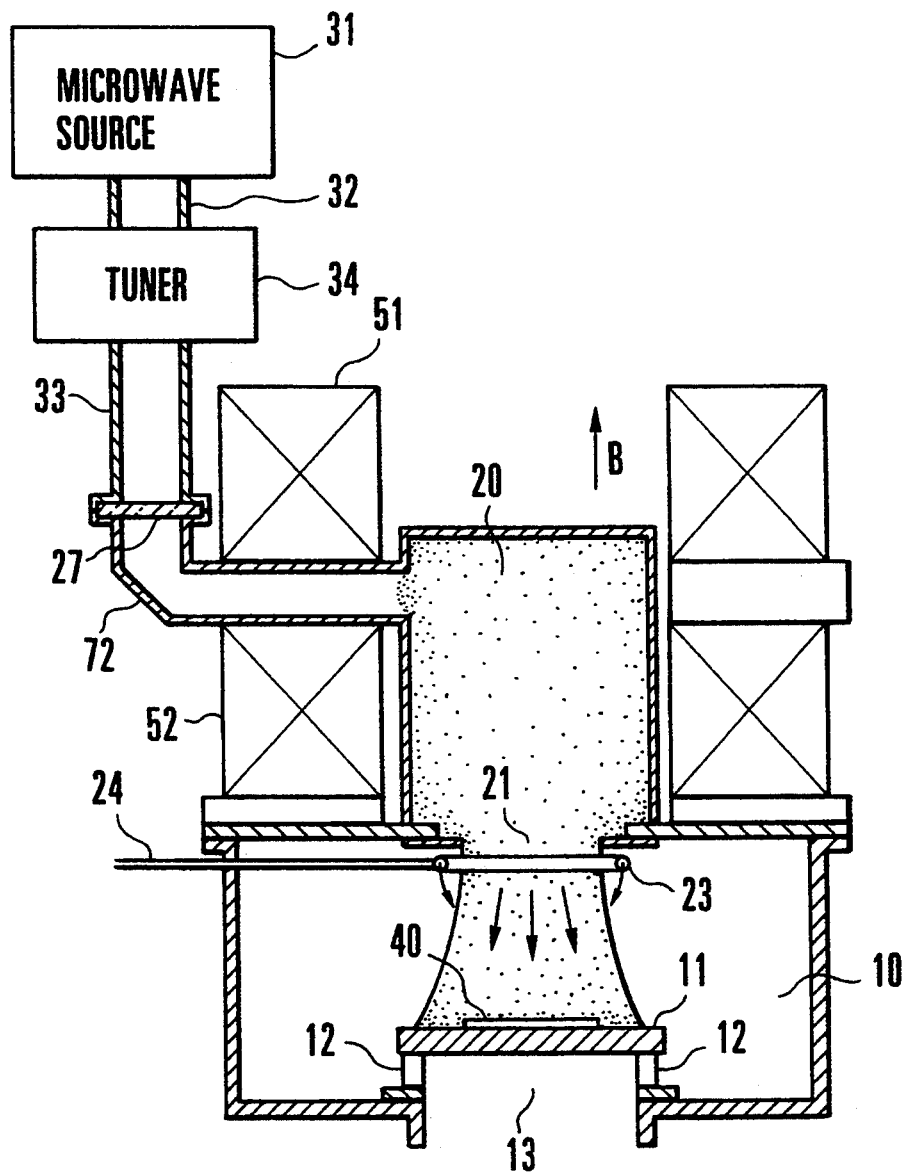
FIG. 16 is a view showing the basic arrangement of another conventional plasma processing apparatus manufactured by taking into account deposition of conductive films on a microwave introducing window.
Figure 17:
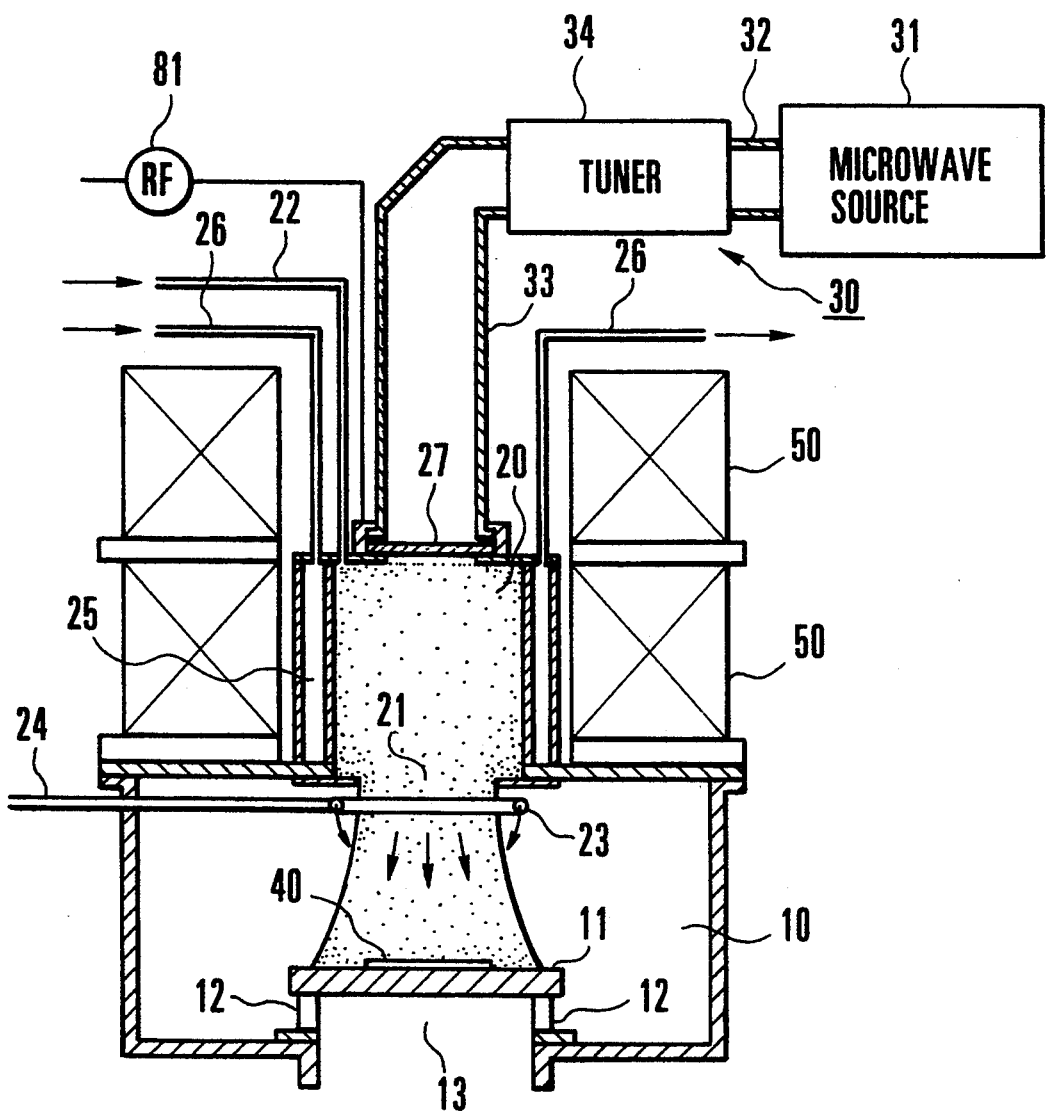
FIG. 17 is a view showing the basic arrangement of still another conventional plasma processing apparatus manufactured by taking into account deposition of conductive films on a microwave introducing window.

FIG. 13 shows an arrangement in which microwaves from two microwave sources 31-1 and 31-2 are guided to a vacuum waveguide 63 through rectangular waveguides 32-1 and 32-2, tuners 34-1 and 34-2, rectangular waveguides 33-1 and 33-2, and microwave introducing windows 27-1 and 27-2, respectively. In this arrangement, a phase tuner 80 adjusts the phases of the microwaves from the microwave sources 31-1 and 31-2 such that the phases differ from each other by 180 degrees at an opening 62 of the vacuum waveguide 63. This consequently achieves the same effects as in the above embodiments.

According to each of the sixth and seventh embodiments of the present invention as has been described above, a plurality of microwave waveguides are arranged such that one end of each microwave waveguide is connected to the microwave introducing hole and the propagating direction of a microwave in each waveguide is perpendicular to an external magnetic field. The microwave reflecting plate is also provided at a position where the microwave waveguides are connected to the microwave introducing hole. As a result, a microwave radiated into the microwave introducing hole is a quasi-TM wave which can be tuned well with a quasi-TM wave as the propagation mode in the plasma chamber when plasma is present in the chamber, so plasma can be generated very efficiently. In addition, since the radiation positions of microwaves are formed on both the sides of the reflecting plate, the electric field strength distribution of the microwave electric field in the plasma chamber becomes uniform. Consequently, a homogeneous plasma is generated to make it possible to perform a surface treatment evenly on a large-diameter specimen. Furthermore, the homogeneity of plasma can be controlled easily because the radiation positions of microwaves can be freely controlled by adjusting the position of the reflecting plate.

In each of the above embodiments, CVD for supplying a raw material in the form of a gas has been described. The present invention, however, is also applicable to a sputtering process in which a metal target is additionally provided at a position, e.g., immediately below a plasma extracting opening 21 to supply a raw material in the form of a solid, as disclosed in "Electron Cyclotron Resonance Plasma Deposition Technique Using Raw Material Supply by Sputtering," Toshiro Ono, Chiharu Takahashi and Seitaro Matuo, JAPANESE JOURNAL OF APPLIED PHYSICS 23 (1984), pp. L534-L536. This arrangement can also provide the same effects as supply of a raw material in the form of a gas.

In the above embodiments, the rectangular waveguide 63-1A can be connected directly to the microwave introducing hole 28 without using the connecting pipe units 63-2 and 63-2A.

In addition, in the embodiment shown in FIG. 11, microwaves are allowed to reach the reflecting plate 70 in two directions. However, it is also possible to allow microwaves to reach the reflecting plate 70 in three directions or more. This similarly applies to other embodiments.

As is apparent from the above description, according to each embodiment of the present invention described above, a microwave passing through the dielectric window propagates in a direction perpendicular to an external magnetic field such that the microwave electric field is parallel to the external magnetic field. This avoids generation of plasma inside the waveguide and diffusion of plasma into the waveguide (i.e., cut-off of the microwave in the waveguide). In addition, the microwave is introduced into the plasma chamber while the propagating direction is bent at a right angle at a location immediately above the plasma chamber, at which the strength of an external magnetic field is higher than the ECR condition. As a result, cut-off of the microwave in the plasma chamber can be prevented. This basically solves the problem of deposition of films on the dielectric window to allow stable generation of a high-density plasma. Consequently, metal films, such as films of Al, Mo, W, Ti, and TiN, and conductive films, such as films of SiC and a-Si, can be stably formed over long periods of time.

What is claimed is:

1. A plasma processing apparatus comprising:
   a plasma chamber having a microwave introducing hole;
   microwave supplying means;
   a first microwave waveguide means for guiding microwave energy from said microwave supplying means;
   a second microwave waveguide means for guiding microwave energy to said microwave introducing hole upon receiving an output from said first microwave waveguide means; and
   external magnetic field supplying means for supplying an external magnetic field to said plasma chamber,
   wherein said second microwave waveguide means comprises a vacuum waveguide and a dielectric window mounted within the second microwave waveguide means with an opening of the second microwave waveguide means being formed contiguous to a side of said microwave introducing hole, said vacuum waveguide being arranged at a position where the external magnetic field applied from said external magnetic field supplying means has a field strength greater than the field strength of a magnetic field which satisfies an ECR condition, and causing the microwave guided from said first microwave waveguide means to propagate through said dielectric window in a direction perpendicular to the external magnetic field such that the electric field of the microwave is parallel to the external magnetic field applied to said second microwave waveguide means by said external magnetic field supplying means,
   said dielectric window is arranged at a position at which at least a portion of said dielectric window cannot be seen directly from said microwave introducing hole, and
   the propagating direction of the microwave is changed at a position immediately above said plasma chamber, at which the external magnetic field strength is higher than the magnetic field strength which satisfies the ECR condition, thereby introducing, through said opening, the microwave to said microwave introducing hole along the external magnetic field,
   whereby converting a raw material in said plasma chamber into plasma by electron cyclotron resonance (ECR).

2. An apparatus according to claim 1, wherein said first microwave waveguide means includes a dividing circuit for dividing the microwave supplied, and
   said vacuum waveguide is connected to all output terminals of said dividing circuit.

3. An apparatus according to claim 1, wherein said microwave supplying means has a plurality of microwave sources, and also has means for adjusting phases of microwave outputs from said microwave sources.

4. An apparatus according to claim 1, wherein at least a portion of an inner wall opposing said opening is insulated from a ground potential.

5. An apparatus according to claim 1, wherein a microwave reflecting plate is suspended from an inner wall of said vacuum waveguide, said inner wall opposing said opening.

6. An apparatus according to claim 1, wherein a connecting pipe is arranged between said opening and said microwave introducing hole.

7. An apparatus according to claim 6, wherein said connecting pipe is a tapered pipe.

8. An apparatus according to claim 1, wherein a reflecting termination is formed on one end of said vacuum waveguide, and the other end of said vacuum waveguide is connected to said first microwave waveguide means through said dielectric window.

* * * * *